United States Patent
Zhang et al.

(10) Patent No.: US 12,520,631 B2
(45) Date of Patent: Jan. 6, 2026

(54) OPTOELECTRONIC DEVICE AND PREPARATION METHOD THEREOF

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 614 days.

(21) Appl. No.: 17/897,397

(22) Filed: Aug. 29, 2022

(65) Prior Publication Data

US 2022/0416129 A1 Dec. 29, 2022

Related U.S. Application Data (63) Continuation of application No. PCT/CN2020/131423, filed on Nov. 25, 2020.

(51) Int. Cl.
*H10H 20/831* (2025.01)
*H10H 20/01* (2025.01)
(Continued)

(52) U.S. Cl.
CPC ........ *H10H 20/8312* (2025.01); *H10H 20/01* (2025.01); *H10H 20/819* (2025.01); *H10H 20/835* (2025.01); *H10H 20/032* (2025.01)

(58) Field of Classification Search
CPC .... H10H 20/01; H10H 20/013; H10H 20/018; H10H 20/032; H10H 20/811;
(Continued)

(56) References Cited

U.S. PATENT DOCUMENTS

| | | |
|---|---|---|
| 2011/0282421 A1 | 11/2011 | Sung |
| 2017/0117437 A1 | 4/2017 | Shur et al. |
| 2024/0063340 A1* | 2/2024 | Keller .......... H10H 29/142 |

FOREIGN PATENT DOCUMENTS

| | | | |
|---|---|---|---|
| CN | 104022203 A | * 9/2014 | .......... H01L 33/007 |
| CN | 105164821 A | 12/2015 | |

(Continued)

OTHER PUBLICATIONS

International Search Report issued in corresponding PCT Application No. PCT/CN2020/131423, dated Aug. 23, 2021.

(Continued)

*Primary Examiner* — Matthew C Landau
*Assistant Examiner* — Dmitriy Yemelyanov
(74) *Attorney, Agent, or Firm* — Westbridge IP LLC (57) ABSTRACT

Disclosed are an optoelectronic device and a preparation method thereof. The optoelectronic device includes a first semiconductor layer, an active layer, and a second semiconductor layer stacked in sequence. The conductivity type of the first semiconductor layer is opposite to that of the second semiconductor layer, and the second semiconductor layer is provided with a layer of nano-diamond structure, and the nano-diamond structure has the same conductivity type as the second semiconductor layer. The method for preparing the optoelectronic device is used to make the optoelectronic device. In the present application, by providing a layer of nano-diamond structure in the second semiconductor layer, the absorption of UV light emitted by the active layer can be effectively avoided, and the beneficial effect of greatly improving the light extraction efficiency of the UV LED can be achieved.

11 Claims, 8 Drawing Sheets

(51) Int. Cl.
*H10H 20/819* (2025.01)
*H10H 20/832* (2025.01)

(58) Field of Classification Search
CPC .. H10H 20/816; H10H 20/817; H10H 20/819; H10H 20/8215; H10H 20/822; H10H 20/8312; H10H 20/835
See application file for complete search history.

(56) References Cited

FOREIGN PATENT DOCUMENTS

| | | | |
|---|---|---|---|
| CN | 108321270 A | 7/2018 | |
| CN | 108321271 A | 7/2018 | |
| CN | 109326689 A | 2/2019 | |
| EP | 2701211 A2 | 2/2014 | |
| JP | 2015212271 A | 11/2015 | |
| WO | WO-2021050731 A1 * | 3/2021 | ........... C30B 25/183 |

OTHER PUBLICATIONS

Written Opinion issued in corresponding PCT Application No. PCT/CN2020/131423, dated Aug. 23, 2021.
First Office Action issued in counterpart Chinese Patent Application No. 202080103793.3, dated Feb. 11, 2025.
Guo et al., Research and development of diamond ultraviolet light emitters, Physics, vol. 33, No. 9, pp. 641-645, dated Sep. 12, 2004.

* cited by examiner

OPTOELECTRONIC DEVICE AND PREPARATION METHOD THEREOF

CROSS-REFERENCE TO RELATED APPLICATIONS

This application is a continuation of International Application No. PCT/CN2020/131423, filed on Nov. 25, 2020, the entire contents of which are incorporated herein by reference.

TECHNICAL FIELD

This application relates to the field of semiconductors, and in particular to an optoelectronic device and a preparation method thereof.

BACKGROUND

In recent years, the light-emitting diode (LED) has gradually become one of the most valued light source technologies. On the one hand, LED has the characteristics of small size; on the other hand, it has the power saving characteristics with low current and low voltage drive. At the same time, LED also has many advantages such as a strong structure, a strong resistance to hitting and shaking, and a super long life. Especially in the ultraviolet region, ultraviolet LEDs with AlGaN-based multi quantum well have shown great advantages and become one of the current hot spots in the development of ultraviolet optoelectronic devices. An ultraviolet LED device with AlGaN-based multiple quantum well has broad application prospects. Ultraviolet light has great application value in screen printing, polymer curing, environmental protection, air and water purification, medical and biomedicine, white light lighting, military detection, space security communications, and the like.

Due to the limited hole injection efficiency of the p-type AlGaN layer, it is difficult to form good ohmic contacts. Therefore, p-GaN layers are often used to make p-type ohmic contacts on the side of the p-type layer, in order to increase the hole injection efficiency of the p-type layer. However, because the p-GaN layer has a strong absorption and a low reflectivity of ultraviolet light (200 nm-365 nm), the light radiated from the quantum well to the p-type layer is absorbed by the p-GaN layer and cannot be extracted, resulting in low light extraction efficiency. Most of the unextracted light is absorbed and converted into heat, which causes the temperature of the device to rise and seriously affects the reliability of the device.

Therefore, how to avoid the short-wavelength UV light being severely absorbed by the P-type layer and improve the light extraction efficiency is still a problem to be solved urgently.

SUMMARY

The present application provides an optoelectronic device and a preparation method thereof.

In order to achieve the above objective, according to a first aspect of the embodiments of the present application, an optoelectronic device is provided. The optoelectronic device includes a first semiconductor layer, an active layer, and a second semiconductor layer stacked in sequence, and a conductivity type of the first semiconductor layer and a conductivity type of the second semiconductor layer are opposite.

A layer of nano-diamond structure is provided in the second semiconductor layer, and the conductivity type of the nano-diamond structure is the same as a conductivity type of the second semiconductor layer.

Optionally, the second semiconductor layer includes a first flat portion, convex portions, and a second flat portion that are sequentially stacked in a vertical direction, and the first flat portion is stacked on the active layer. The nano-diamond structure is provided on the first flat portion and includes a plurality of nano-diamond protrusions arranged at intervals along a horizontal direction. A gap is provided between two adjacent nano-diamond protrusions. The convex portions of the second semiconductor layer are located in the gaps, the second flat portion is provided on the convex portions and the nano-diamond structure, and the side of the second flat portion away from the convex portions is a flat surface.

Optionally, the nano-diamond structure is formed by a CVD process.

Optionally, the nano-diamond protrusions are nano-scale diamond grains, and the grain size of the nano-scale diamond grains is less than or equal to 200 nm.

Optionally, the active layer has a multiple quantum well structure.

Optionally, the materials of the first semiconductor layer and the second semiconductor layer are both wide bandgap semiconductor materials, and the band gap of the wide bandgap semiconductor materials are greater than 2.0 eV.

Optionally, the optoelectronic device further includes a substrate and a buffer layer, and the buffer layer is provided between the substrate and the first semiconductor layer in a vertical direction.

Optionally, the optoelectronic device further includes a first electrode and a second electrode.

The second semiconductor layer is provided with a groove, the groove penetrates the second semiconductor layer and the active layer, and at least a part of the first semiconductor layer is left under the groove.

The first electrode is located at the bottom of the groove and connected to the first semiconductor layer.

The second electrode is provided on the second semiconductor layer and connected to the second semiconductor layer.

Optionally, the optoelectronic device further includes a first electrode and a second electrode; the first electrode is provided under the first semiconductor layer; the second electrode is provided on the second semiconductor layer superior.

Optionally, the second electrode contains a mirror material.

According to the second aspect of the embodiments of the present application, a method for preparing an optoelectronic device is provided. The method for preparing the optoelectronic device includes the following steps.

S100: forming a first semiconductor layer and an active layer on the substrate in sequence.

S200: forming a second semiconductor layer and a nano-diamond structure on the active layer, where the nano-diamond structure is provided in the second semiconductor layer. The conductivity type of the second semiconductor layer and the conductivity type of the first semiconductor layer are opposite, and the conductivity type of the nano-diamond structure is the same as that of the second semiconductor layer.

Optionally, the second semiconductor layer includes a first flat portion, a protruding portion, and a second flat portion that are sequentially stacked in a vertical direction.

Optionally, step S200 includes: through a first epitaxial growth, forming a first flat portion of a second semiconductor layer on the active layer, and forming a nano-diamond structure on the first flat portion of the second semiconductor layer, where the nano-diamond structure includes a plurality of nano-diamond protrusions arranged at intervals, and a gap is formed between two adjacent nano-diamond protrusions; using the nano-diamond protrusions as a mask to implement secondary epitaxial growth for the second semiconductor layer, forming convex portions of the second semiconductor layer in the gaps, forming a second flat portion of the second semiconductor layer on the upper surface of the nano-diamond structure and the convex portions, a side of the second flat portion away from the convex portions is a flat surface.

Optionally, in step S100, the first semiconductor layer and the active layer are formed by an MOCVD process.

In step S200, the second semiconductor layer is formed by the MOCVD process; the nano-diamond structure is formed by the CVD process.

Optionally, step S100 includes:

S110: forming a buffer layer on the substrate.

S120: forming the first semiconductor layer and the active layer on the buffer layer in sequence.

Optionally, the method for preparing the optoelectronic device further includes:

S300: forming a groove on the second semiconductor layer by etching, the groove penetrates the second semiconductor layer and the active layer, and at least part of the first semiconductor layer is left under the groove.

S400: forming a first electrode on the bottom of the groove; forming a second electrode on the second semiconductor layer.

Optionally, the method for preparing the optoelectronic device further includes:

S500: peeling off the substrate.

S600: forming a first electrode under the first semiconductor layer; forming a second electrode on the second semiconductor layer.

DETAILED DESCRIPTION OF THE EMBODIMENTS

Exemplary embodiments will be described herein in detail, and examples thereof are shown in the accompanying drawings. When the following description refers to the drawings, unless otherwise indicated, the same numbers in different drawings indicate the same or similar elements. The implementation manners described in the following exemplary embodiments do not represent all implementation manners consistent with the present application. On the contrary, they are merely examples of devices and methods consistent with some aspects of the present application as detailed in the appended claims.

Embodiment 1

Figure 1:
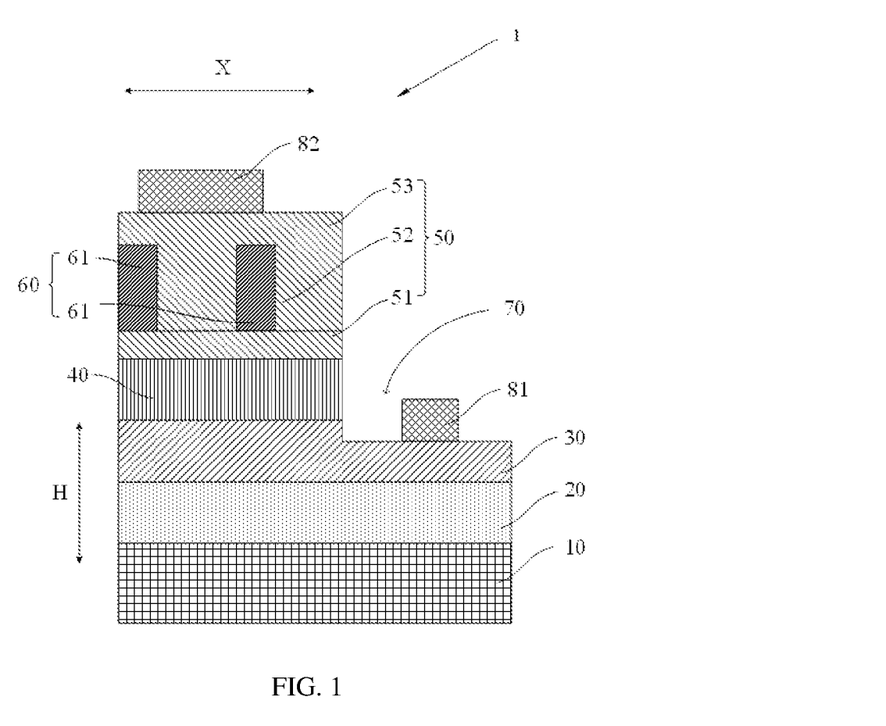
FIG. 1 is a schematic cross-sectional structure diagram of an optoelectronic device of Embodiment 1 of the present application.

With reference to FIG. 1, this embodiment provides an optoelectronic device 1. The optoelectronic device 1 includes a first semiconductor layer 30, an active layer 40, and a second semiconductor layer 50, which are stacked in sequence. The conductivity type of the first semiconductor layer 30 and the conductivity type of the second semiconductor layer 50 are opposite. A layer of a nano-diamond structure 60 is provided in the second semiconductor layer 50, and the conductivity type of the nano-diamond structure 60 is the same as that of the second semiconductor layer 50.

Figure 2A:
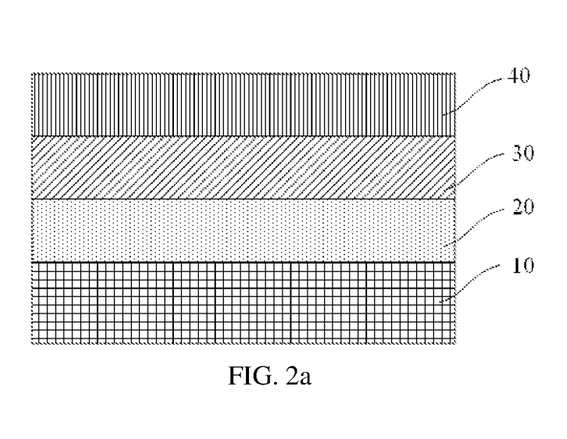
FIG. 2a-FIG. 2f are process flow diagrams of a method for preparing the optoelectronic device of Embodiment 1 of the present application.
Figure 2B:
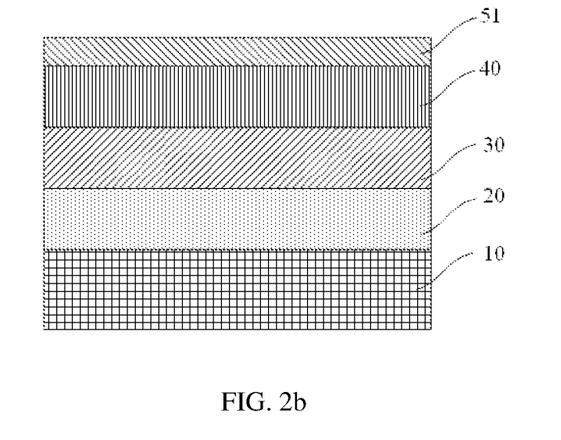
Figure 2C:
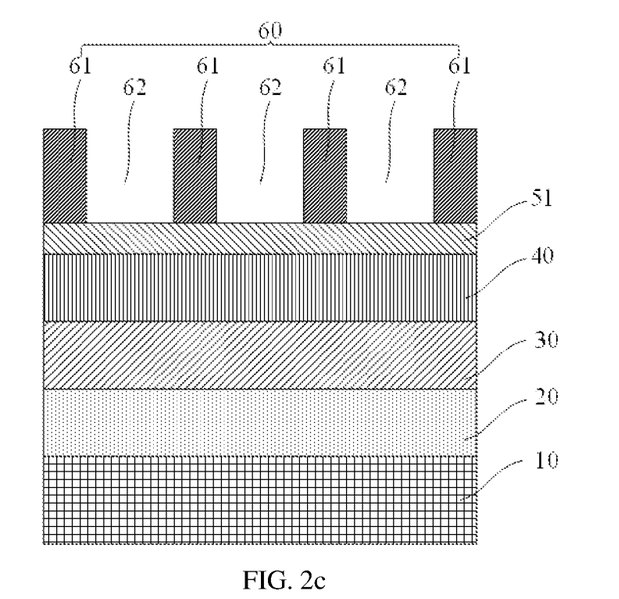

Specifically, the second semiconductor layer 50 includes a first flat portion 51, convex portions 52, and a second flat portion 53 that are sequentially stacked in the vertical direction H. The nano-diamond structure 60 includes a plurality of nano-diamond protrusions 61 arranged at intervals along the horizontal direction X, and a gap 62 is provided between two adjacent nano-diamond protrusions 61, which is shown in FIG. 2c.

The first flat portion 51 is stacked on the active layer 40, and the nano-diamond structure 60 is provided on the first flat portion 51. The convex portions 52 of the second semiconductor layer 50 are located in the gaps 62, and the convex portions 52 of the second semiconductor layer 50 correspond to the gaps 62 one-to-one. The second flat portion 53 is provided on the convex portions 52 and the nano-diamond structure 60, and the side of the second flat portion 53 away from the convex portions 52 is a flat surface.

The nano-diamond protrusions 61 are nano-scale diamond grains, and the grain size of the nano-scale diamond grains is less than or equal to 200 nm.

In this embodiment, the nano-diamond structure 60 is formed by a chemical vapor deposition (CVD) process. A plurality of nano-scale diamond grains arranged at intervals can be directly formed by a CVD process.

The materials of the first semiconductor layer 30 and the second semiconductor layer 50 are both wide bandgap semiconductor materials, and the band gap of the wide bandgap semiconductor materials are greater than 2.0 eV. Specifically, the wide bandgap semiconductor materials may be a gallium nitride-based material, or boron nitride, or indium tin oxide (ITO) or the like.

The active layer 40 has a multiple quantum well structure.

In this embodiment, the optoelectronic device 1 also includes a substrate 10, a buffer layer 20, a first electrode 81, and a second electrode 82. The buffer layer 20 is provided between the substrate 10 and the first semiconductor layer 30 in the vertical direction.

A groove 70 is disposed on the second semiconductor layer 50, and the groove 70 penetrates the second semiconductor layer 50 and the active layer 40, and at least a part of the first semiconductor layer 30 is left under the groove 70. The first electrode 81 is located at the bottom of the groove 70 and is connected to the first semiconductor layer 30.

The second electrode 82 is provided on the second semiconductor layer 50 and connected to the second semiconductor layer 50.

Figure 5:
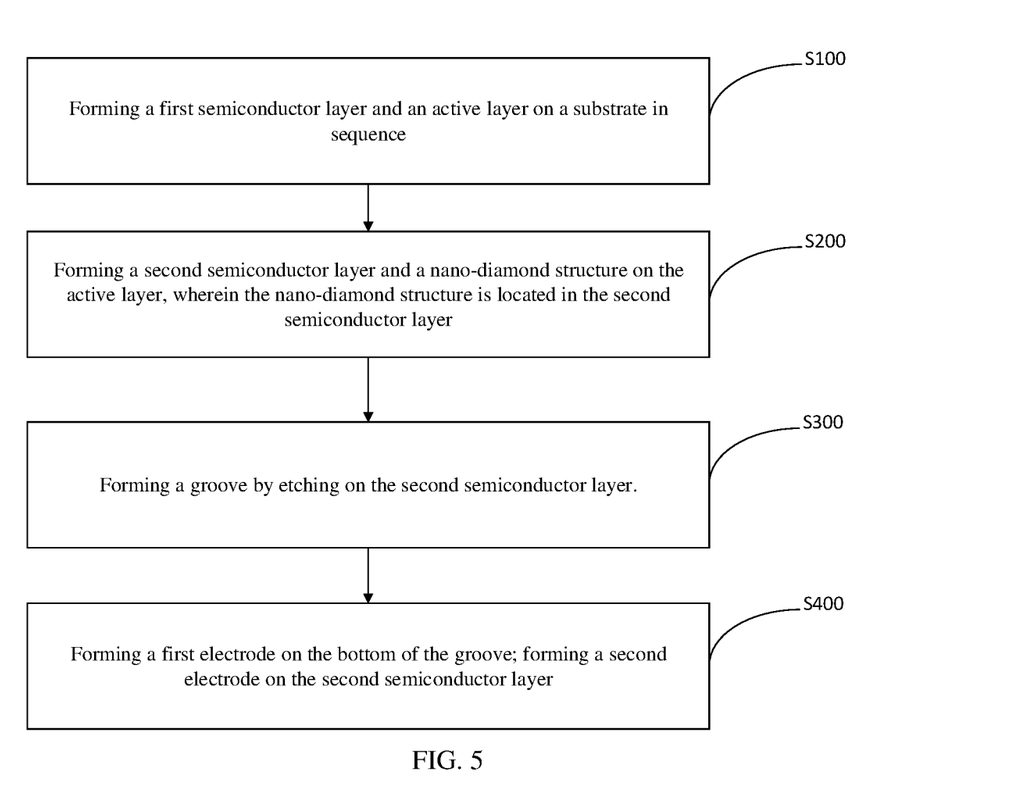
FIG. 5 is a flowchart of a method for preparing the optoelectronic device of the present application.

FIG. 2a-FIG. 2f are process flow diagrams of the method for preparing the optoelectronic device of Embodiment 1 of the present application. FIG. 5 is a flowchart of a method for preparing the optoelectronic device of the present application. The preparation method is used to make the optoelectronic device as described above. The method for preparing the optoelectronic device includes the following steps:

Step S100: forming a first semiconductor layer and an active layer on a substrate in sequence.

Step S200: forming a second semiconductor layer and a nano-diamond structure on the active layer. Here, the nano-diamond structure is located in the second semiconductor layer. The conductivity type of the second semiconductor layer and the conductivity type of the first semiconductor layer are opposite, and the conductivity type of the nano-diamond structure is the same as that of the second semiconductor layer.

Step S300: forming a groove by etching on the second semiconductor layer. The groove penetrates the second semiconductor layer and the active layer, and at least part of the first semiconductor layer is left below the groove.

Step S400: forming a first electrode on the bottom of the groove; forming a second electrode on the second semiconductor layer.

Figure 6:
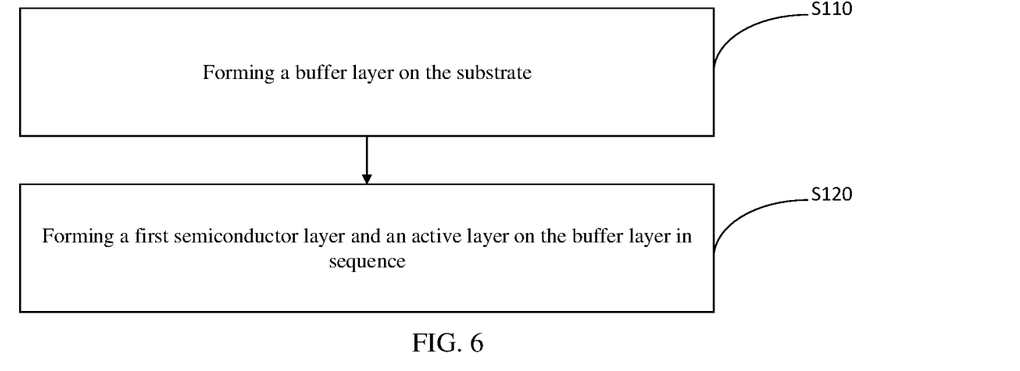
FIG. 6 is a flowchart of sub-steps in the method for preparing the optoelectronic device of the present application.

FIG. 6 is a flowchart of sub-steps in the method for preparing the optoelectronic device of the present application. Specifically, as shown in FIG. 2a, at step S100, forming the first semiconductor layer and the active layer by the metal organic chemical vapor deposition (MOCVD) process includes:

S110: forming a buffer layer 20 on the substrate 10.

S120: forming a first semiconductor layer 30 and an active layer 40 on the buffer layer 20 in sequence.

Figure 2D:
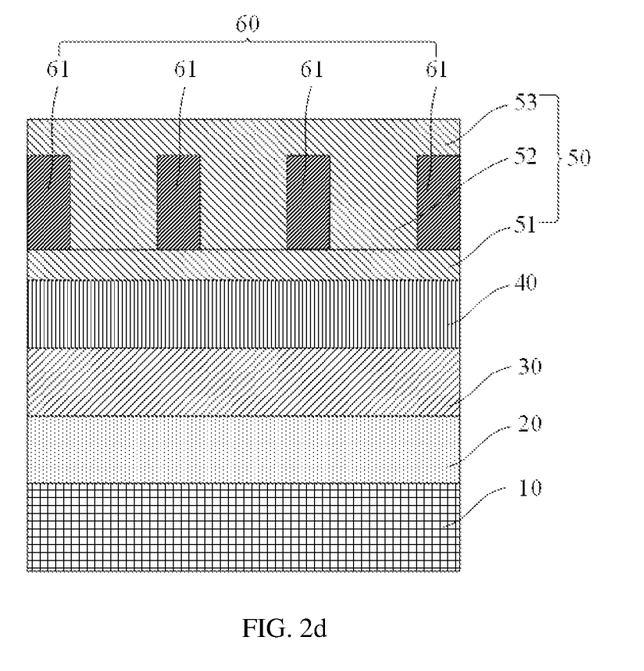

At step S200, the second semiconductor layer 50 is formed by a MOCVD process, and the second semiconductor layer 50 includes a first flat portion 51, convex portions 52, and a second flat portion 53 that are sequentially stacked in the vertical direction. A nano-diamond structure 60 is formed by the CVD process. The nano-diamond structure 60 includes a plurality of nano-diamond protrusions 61 arranged at intervals along the horizontal direction X, and a gap 62 is formed between two adjacent nano-diamond protrusions 61.

Specifically, as shown in FIG. 2b, the first flat portion 51 of the second semiconductor layer 50 is formed on the active layer 40 through the first epitaxial growth.

As shown in FIG. 2c, a nano-diamond structure 60 is formed on the first flat portion 51 of the second semiconductor layer 50, that is, a plurality of nano-diamond protrusions 61 arranged at intervals are formed on the first flat portion 51 of the second semiconductor layer 50.

Next, as shown in FIG. 2d, the second epitaxial growth is implemented for the second semiconductor layer 50 using the nano-diamond protrusion 61 as a mask. The convex portions 52 of the second semiconductor layer 50 are formed in the gaps 62. The second flat portion 53 of the second semiconductor layer 50 is formed on the upper surface of the nano-diamond structure 60 and the convex portions 52. The convex portions 52 of the second semiconductor layer 50 correspond to the gaps 62 one-to-one, and the side of the second flat portion 53 away from the convex portions 52 is a flat surface.

It should be noted that the first semiconductor layer 30, the active layer 40, and the second semiconductor layer 50 can be formed not only by metal organic chemical vapor deposition (MOCVD) process, but also by molecular beam epitaxy (MBE) and other processes.

Figure 2E:
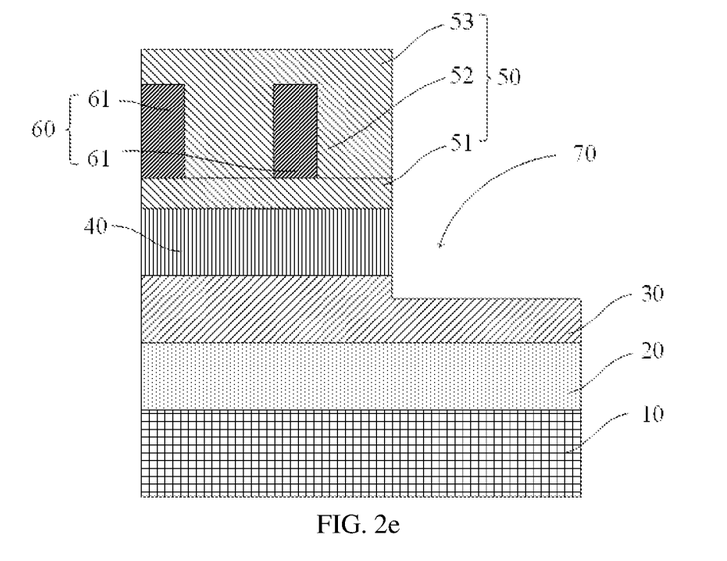

At step S300, as shown in FIG. 2e, a groove 70 is formed by etching on the second semiconductor layer 50, and the groove 70 penetrates the second semiconductor layer 50 and the active layer 40. At least a part of the first semiconductor layer 30 is remained below the groove 70.

Figure 2F:
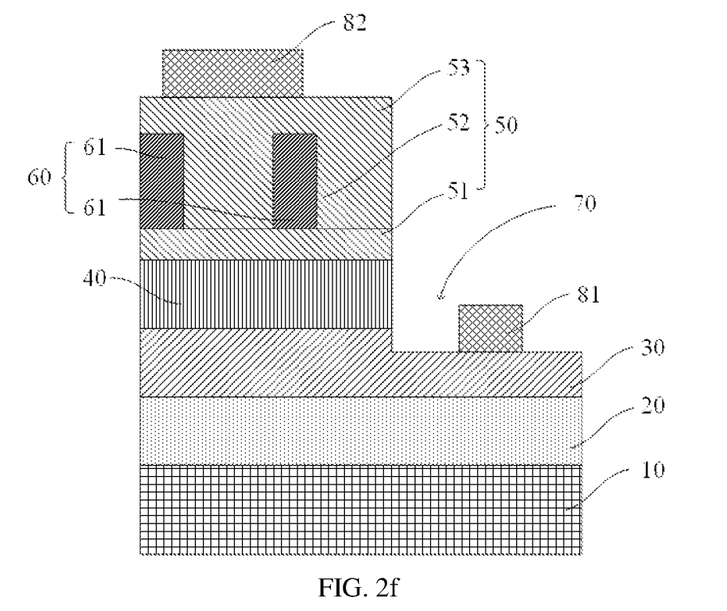

At step S300, as shown in FIG. 2f, a first electrode 81 is formed at the bottom of the groove 70; a second electrode 82 is formed on the second semiconductor layer 50.

In the optoelectronic device and the preparation method thereof according to this embodiment, by providing a layer of nano-diamond structure in the second semiconductor layer, the absorption of UV light emitted by the active layer can be effectively avoided, thereby achieving the beneficial effect of greatly improving the light extraction efficiency of the UV LED. This is because, firstly, the nano-diamond structure has a weak absorption effect on the full-wavelength light, which reduces light absorption and can effectively improve the light extraction efficiency of LEDs, especially UV LEDs. Secondly, the bandgap of diamond is relatively large, which has a strong reflecting effect to electrons and can reduce electron leakage, thereby increasing brightness, that is, improving light extraction efficiency. Thirdly, the nano-diamond structure is easy to dope, and the hole concentration is high, which facilitates preparation of ohmic contacts.

Embodiment 2

Figure 3:
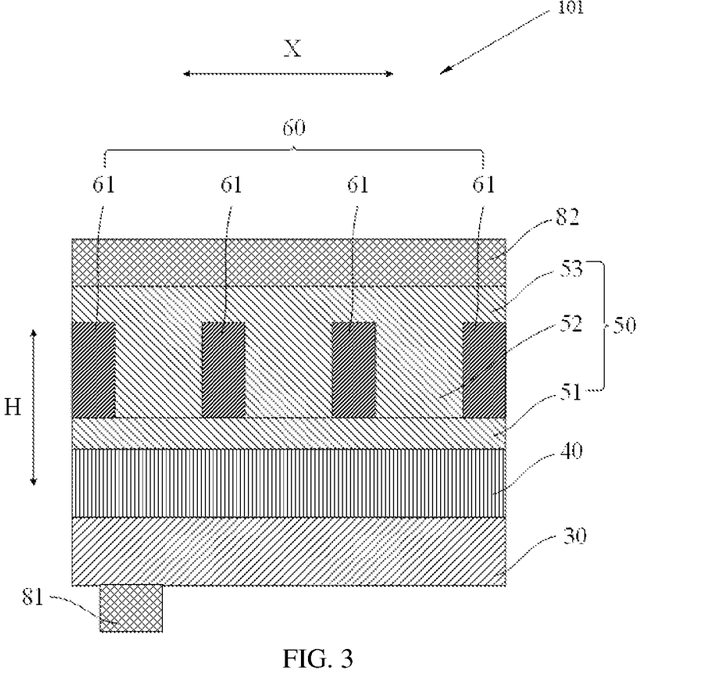
FIG. 3 is a cross-sectional structure schematic diagram of an optoelectronic device of Embodiment 2 of the present application.

As shown in FIG. 3, this embodiment provides an optoelectronic device 101. The structure of the optoelectronic device 101 is basically the same as that of the optoelectronic device 1 of Embodiment 1. The difference lies in that the optoelectronic device 101 of this embodiment does not include the substrate 10 and the buffer layer 20, and the arrangement positions of the first electrode 81 and the second electrode 82 are different from those of the first electrode 81 and the second electrode 82 of Embodiment 1. Specifically, in this embodiment, the first electrode 81 is provided below the first semiconductor layer 30; the second electrode 82 is provided above the second semiconductor layer 50.

Further, the orthographic projection of the second electrode 82 on the second semiconductor layer 50 overlaps with the outer periphery of the second semiconductor layer 50. The second electrode 82 contains a mirror material to further improve the luminous efficiency of the device. Specifically, the mirror material is aluminum, silver, titanium or other materials that have a reflective effect.

Figure 4A:
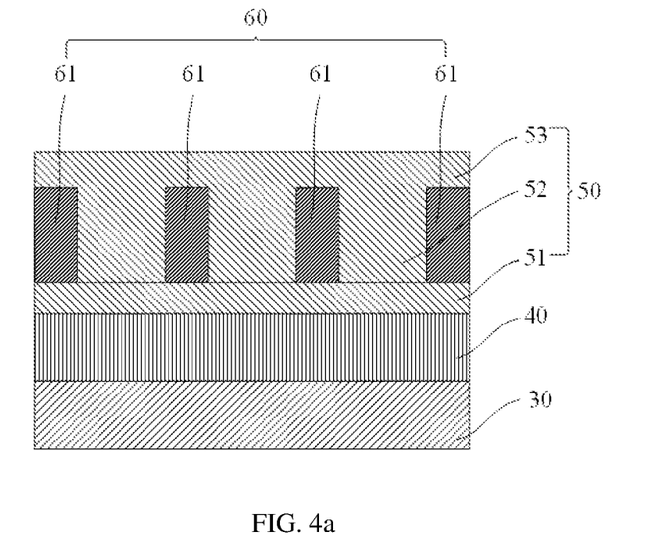
FIG. 4a-FIG. 4b are process flow diagrams of a method for preparing the optoelectronic device of Embodiment 2 of the present application.
Figure 4B:
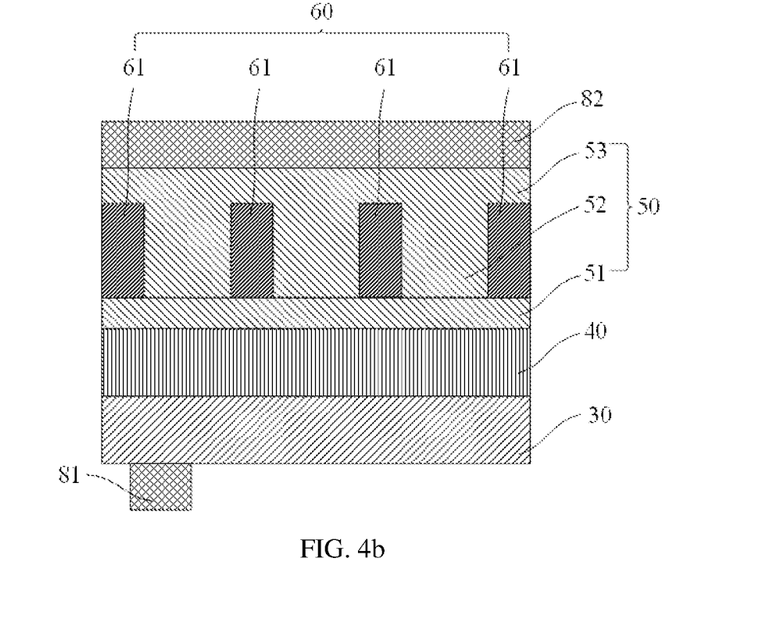
Figure 7:
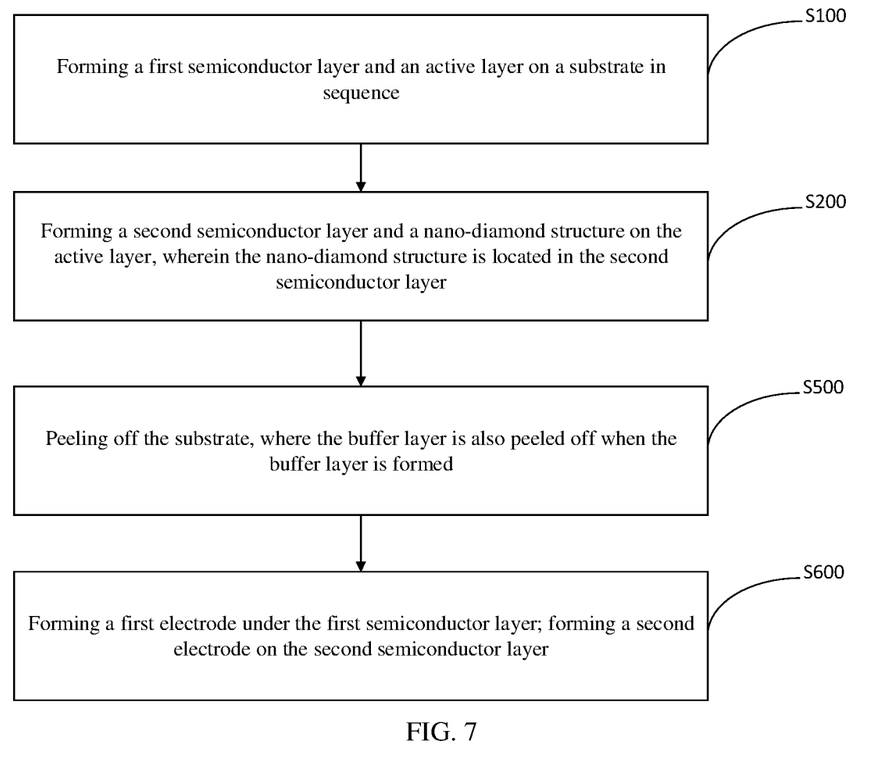
FIG. 7 is a flowchart of another method for preparing the optoelectronic device of the present application.

As shown in FIG. 4a-FIG. 4b, another aspect of this embodiment also provides a method for preparing the above-mentioned optoelectronic device. FIG. 7 is a flowchart of the method for preparing the optoelectronic device of this embodiment. The method of preparing this embodiment has basically the same steps as the preparation method of Embodiment 1, and the difference lies in that after step S200 is completed, the method for preparing the optoelectronic device of this embodiment further includes:

Step S500: as shown in FIG. 4a, peeling off the substrate, and peeling off the buffer layer if the buffer layer is formed.

Step S600: as shown in FIG. 4b, forming a first electrode 81 under the first semiconductor layer 30; and forming a second electrode 82 on the second semiconductor layer 50.

The above descriptions are only preferred embodiments of this application and are not intended to limit this application. Any modification, equivalent replacement, improvement, etc. made within the spirit and principle of this application shall include Within the scope of protection of this application.

What is claimed is:

1. An optoelectronic device, comprising a first semiconductor layer, an active layer, and a second semiconductor layer stacked in sequence, a conductivity type of the first semiconductor layer and a conductivity type of the second semiconductor layer being opposite,
    wherein a layer of nano-diamond structure is provided in the second semiconductor layer, a conductivity type of the nano-diamond structure is the same as the conductivity type of the second semiconductor layer, the second semiconductor layer comprises a first flat portion and a second flat portion that are sequentially stacked in a vertical direction, the first flat portion is stacked on the active layer, the nano-diamond structure is provided on the first flat portion, and the second flat portion is provided on the nano-diamond structure.

2. The optoelectronic device according to claim 1, wherein the second semiconductor layer further comprises convex portions, the nano-diamond structure comprises a plurality of nano-diamond protrusions arranged at intervals along a horizontal direction, gaps are provided between two adjacent nano-diamond protrusions, the convex portions of the second semiconductor layer are located in the gaps, the second flat portion is provided on the convex portions and the nano-diamond structure, and a side of the second flat portion away from the convex portions is a flat surface.

3. The optoelectronic device according to claim 2, wherein the convex portions of the second semiconductor layer correspond to the gaps one-to-one.

4. The optoelectronic device according to claim 2, wherein the nano-diamond protrusions are nano-scale diamond grains, and a grain size of the nano-scale diamond grains is less than or equal to 200 nm.

5. The optoelectronic device according to claim 1, wherein materials of the first semiconductor layer and the second semiconductor layer are both wide bandgap semiconductor materials, and band gap of the wide bandgap semiconductor materials are greater than 2.0 eV.

6. The optoelectronic device according to claim 1, further comprising a substrate and a buffer layer, and the buffer layer is provided between the substrate and the first semiconductor layer in a vertical direction.

7. The optoelectronic device according to claim 1, further comprising a first electrode and a second electrode; wherein
    a groove is formed on the second semiconductor layer, the groove penetrates the second semiconductor layer and the active layer, and at least a part of the first semiconductor layer is left under the groove;
    the first electrode is located at a bottom of the groove and connected to the first semiconductor layer; and
    the second electrode is provided on the second semiconductor layer and connected to the second semiconductor layer.

8. The optoelectronic device according to claim 1, further comprising a first electrode and a second electrode; the first electrode is provided under the first semiconductor layer; the second electrode is provided on the second semiconductor layer.

9. The optoelectronic device according to claim 8, wherein the second electrode contains a mirror material.

10. The optoelectronic device according to claim 9, wherein the mirror material is aluminum, silver, titanium, or another material that has a reflective effect.

11. The optoelectronic device according to claim 8, wherein an orthographic projection of the second electrode on the second semiconductor layer overlaps with an outer periphery of the second semiconductor layer.

* * * * *